(12) United States Patent
Anderson et al.

(10) Patent No.: US 7,910,418 B2
(45) Date of Patent: Mar. 22, 2011

(54) COMPLEMENTARY METAL GATE DENSE INTERCONNECT AND METHOD OF MANUFACTURING

(75) Inventors: Brent A. Anderson, Jericho, VT (US); Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 12/022,292

(22) Filed: Jan. 30, 2008

(65) Prior Publication Data

US 2009/0189223 A1    Jul. 30, 2009

(51) Int. Cl.
*H01L 21/336* (2006.01)
*H01L 21/8234* (2006.01)
(52) U.S. Cl. ........... 438/197; 438/199; 257/E21.632
(58) Field of Classification Search .......... 438/195, 438/199, 573, 588; 257/E21.632
See application file for complete search history.

(56) References Cited

U.S. PATENT DOCUMENTS

| 5,496,771 | A | 3/1996 | Cronin et al. | |
|---|---|---|---|---|
| 5,677,563 | A | 10/1997 | Cronin et al. | |
| 5,897,372 | A | 4/1999 | Howard | |
| 5,913,139 | A | 6/1999 | Hashimoto et al. | |
| 6,461,967 | B2 | 10/2002 | Wu et al. | |
| 6,522,001 | B2 | 2/2003 | Trivedi | |
| 7,183,611 | B2 | 2/2007 | Bhattacharyya | 257/347 |
| 2006/0151833 | A1* | 7/2006 | Yang et al. | 257/347 |
| 2006/0237796 | A1* | 10/2006 | Cartier et al. | 257/371 |
| 2008/0099851 | A1* | 5/2008 | Hsu et al. | 257/369 |
| 2008/0211038 | A1* | 9/2008 | Yun et al. | 257/412 |
| 2008/0237867 | A1* | 10/2008 | Wong et al. | 257/757 |

\* cited by examiner

*Primary Examiner* — Hoai V Pham
(74) *Attorney, Agent, or Firm* — Richard Kotulak; Roberts Mlotkowski Safran & Cole, P.C.

(57) ABSTRACT

Complementary metal gate dense interconnects and methods of manufacturing the interconnects is provided. The method comprises forming a first metal gate on a wafer and second metal gate on the wafer. A conductive interconnect material is deposited in a space formed between the first metal gate and the second metal gate to provide an electrical connection between the first metal gate and the second metal gate.

16 Claims, 11 Drawing Sheets

COMPLEMENTARY METAL GATE DENSE INTERCONNECT AND METHOD OF MANUFACTURING

FIELD OF THE INVENTION

The present invention generally relates to metal gate interconnects and methods of manufacturing the interconnects, and more specifically, to complementary metal gate dense interconnects and methods of manufacturing the interconnects.

BACKGROUND OF THE INVENTION

In conventional polysilicon-gate CMOS technologies, there is nearly always an nFET associated with one pFET in a given circuit, where the two FETs have a common input. In the corresponding structure a single polysilicon gate structure is shared by the corresponding nFET and pFET, allowing close placement of the nFET to the pFET and also enabling a single contact to provide a path from the wiring to both gates. This results in superior circuit density.

In some versions of CMOS that employ metal-gate/high-k gate-dielectric stacks, the pFET and nFET gate stacks differ from one another in order to accommodate optimal nFET and pFET properties, such as drive current, immunity from short-channel effects, and leakage. As a result nFET/pFET pairs of device that electrically share a gate cannot physically share a gate as in the case of polysilicon-gate CMOS technology. Hence the metal-gate/high-k gate-dielectric stack device pairs will occupy more physical space and result in lower circuit density, increased production cost, and increased circuit power.

Accordingly, there exists a need in the art to overcome the deficiencies and limitations described hereinabove.

SUMMARY OF THE INVENTION

In a first aspect of the invention, a method comprises forming a first metal gate on a wafer and second metal gate on the wafer. A conductive interconnect material is deposited in a space formed between the first metal gate and the second metal gate to provide an electrical connection between the first metal gate and the second metal gate.

In an additional aspect of the invention, a method comprises forming a first gate of a first conductivity type on a substrate and a second gate of a second conductivity type on the wafer, remote from the first gate. An interconnect structure is deposited in a space between the first gate and the second gate. The interconnect structure is also in electrical contact with the first gate and the second gate.

In a further aspect of the invention, a structure comprises a first metal gate on a wafer and a second metal gate on the wafer. A conductive material is in a space between the first metal gate and the second metal gate and in electrical connection with the first metal gate and the second metal gate.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to metal gate interconnects and methods of manufacturing the metal gate interconnects. More specifically, the present invention relates to complementary metal gate dense interconnects and methods of manufacturing such dense interconnects. By implementing the invention, it is now possible to provide a dense, direct interconnection between nFET and pFET metal gates in metal-gate/high-k-gate-dielectric CMOS. For example, in embodiments, the semiconductor structure of the present invention includes two gate stacks that are comprised of different metal materials, e.g., Tantalum and Titanium. The gate stacks can equally include other metal materials and their nitrides or other rare earth elements, depending on the specific technology application and desired tailoring needed for such applications. The metal gates, in embodiments, reside on an insulator such as, for example, a shallow trench isolation structure of a high-K dielectric layer. The metal gates are connected by a metal that extends at least partially into a space between the two metal gates.

First Aspect of the Invention

Figure 1:
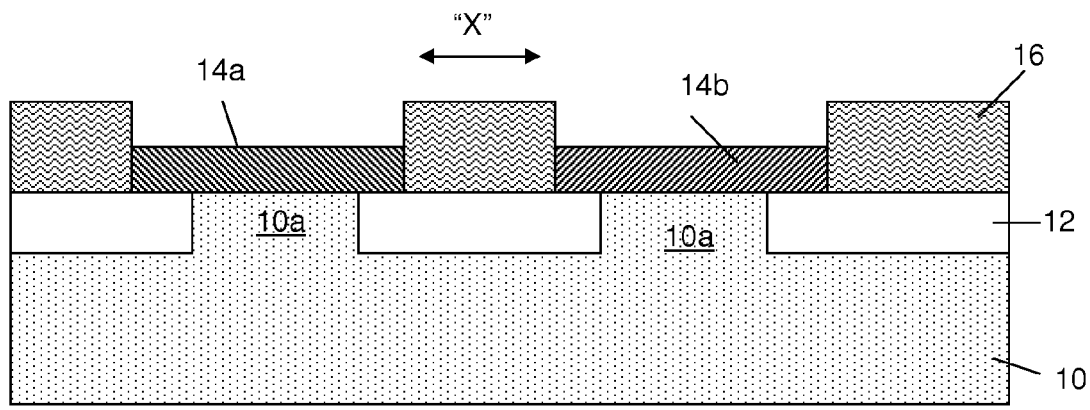
FIGS. 1-5 show structures and respective processing steps for forming a dense interconnect structure in accordance with a first aspect of the invention.

FIG. 1 shows a starting structure and respective processing steps for forming a dense interconnect structure in accordance with a first aspect of the invention. The starting structure includes, for example, shallow trench isolation structures 12 formed in a silicon or BULK wafer 10. The shallow trench isolation structures 12 can be formed in any conventional manner known by those of skill in the art. For example, the shallow trench isolation structures 12 can be formed by etching trenches into the wafer 10 and filling the trenches with isolation material. The isolation material may be, for example, silicon dioxide or any other known insulator material. The shallow trench isolation structures 12 can be about 20 nm to about 150 nm in depth. Islands 10a are formed between the shallow trench isolation structures 12.

Still referring to FIG. 1, metal gates 14a and 14b are formed over the islands 10a and, in embodiments, extend over the shallow trench isolation structures 12. Insulator material 16 extends between and on the sides of the metal gates 14a and 14b. The insulator material 16 may be, for example, oxide, nitride or other high k dielectric material. The insulator material 16 may be about 90 nm to 300 nm in height and is preferably about three times the height of the metal gates 14a and 14b. In embodiments, the metal gates 14a and 14b are recessed in comparison to the surrounding insulator material 16, as a result of the processes described herein.

In embodiments, the metal gates 14a and 14b are separated by a distance "X", which is a technology critical dimension. The metal gates 14a and 14b are composed of different materials and are used for nFETs and pFETS in a CMOS device. By way of example, the metal gate 14a may be Titanium, TiN or Titanium tailored with rare earth elements; whereas, the metal gate 14b may be Tungsten, Tungsten Nitride or Tungsten tailored with rare earth elements. Of course, it should be recognized by those of skill in the art that the material of the metal gates 14a and 14b may be reversed, or may include additional or alternative conductive material known to be used with CMOS devices.

In embodiments, the metal gates 14a and 14b can be formed using different conventional fabrication processes. For example, in one embodiment, the insulator material 16 may be blanket deposited over the entire structure, including the shallow trench isolation structures 16 and the islands 10a. A block (resist) material may be deposited over the insulator material 16. A mask material is then deposited over areas of the pFET or the nFET, depending on which metal gate is to be formed at this fabrication process. For reasons of discussion, the mask is formed over the pFET locations; although it is understood that the mask can equally be formed over the nFET locations. Once the mask is formed, using conventional photolithographic processes, holes are opened to expose portions of the insulator material 16 corresponding to the nFET. The exposed portions of the insulator material 16 are then etched using a conventional reactive ion etching process. Once the insulator material 16 is etched away, the metal material is deposited within the holes to form the nFET. This process can be repeated to form the pFET side of the CMOS.

In alternative embodiments, holes can be opened simultaneously for both the nFET and pFET of the CMOS. In this alternative embodiment, the holes for the nFET can be filled with blocking material prior to the metal deposition of the pFET, or vice versa. Once the nFET hole is blocked, metal can be deposited in the hole to form the pFET. The blocking material is removed, and blocking material is placed over the metal material which forms the pFET. The nFET can then be formed by a similar metal deposition process.

Figure 2:
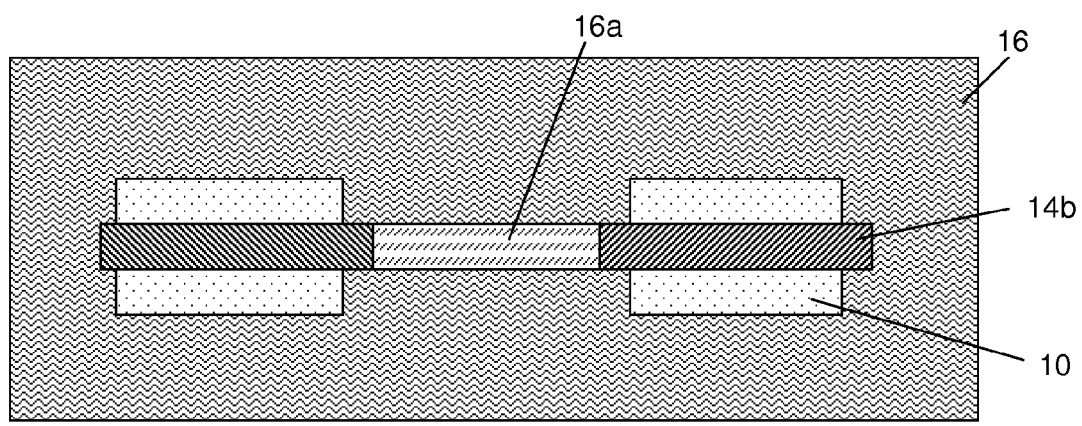

FIG. 2 shows a top view of the structure of FIG. 1. More specifically, FIG. 2 shows that the insulator material 16 between the metal gates 14a and 14b is slightly elevated at reference numeral 16a. This slightly elevated area 16 is used in subsequent processing steps for self aligning metal interconnects formed between the metal gates 14a and 14b.

Figure 3:
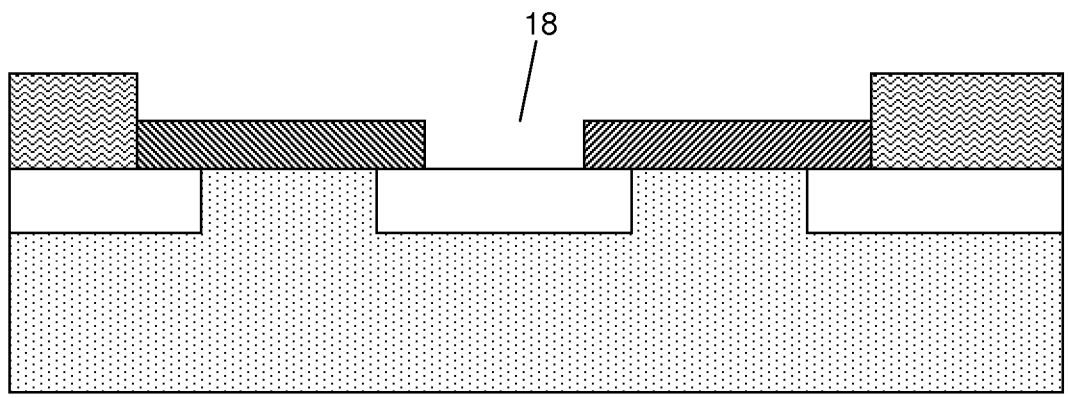

FIG. 3 shows the formation of a trench 18 between the two metal gates 14a, 14b. To form the trench, a resist is placed over the structure and exposed to form a hole. Once the hole is formed, an etching process is then used to form the trench 18. Also, the resist is stripped in a conventional process.

Figure 4:
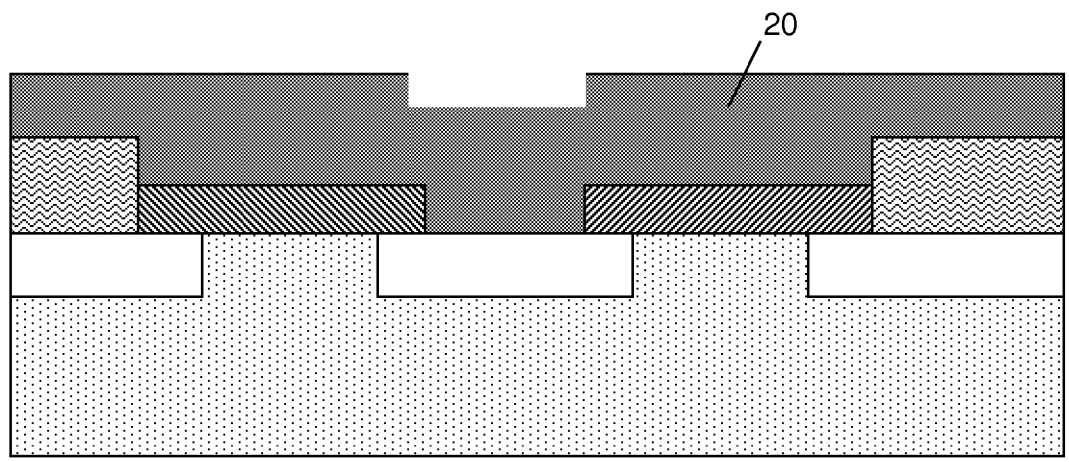

FIG. 4 shows an intermediate structure and respective processing steps for forming the dense interconnect structure in accordance with the first aspect of the invention. More specifically, in FIG. 4, a conductive material 20 is blanket deposited over the structure of FIG. 3. In this manner, the conductive material 20 fills the trench 18 formed between the metal gates 14a and 14b. The conductive material 20 thus makes electrical contact with the metal gates 14a and 14b. The conductive material 20 may be, for example, aluminum or tungsten. Alternatively, the conductive material may be doped polysilicon.

Figure 5:
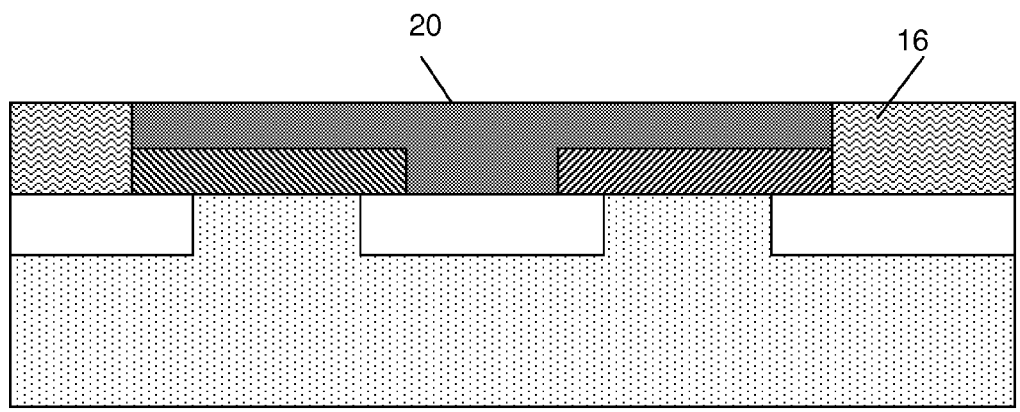

As shown in FIG. 5, the structure of FIG. 4 is polished or planarized to form the final structure in accordance with the first aspect of the invention. More specifically, the conductive material 20 is subjected to a chemical mechanical polish in order to provide a substantial planar surface with the insulator material 16. The planarizing or polishing process of FIG. 5 forms a conductive filler strap 20 that extends between the metal gates 14a and 14b in the trench. In further embodiments, the conductive material also extends over the metal gates 14a, 14b to the insulator material 16. In embodiments, the conductive filler strap 20 can be etched to extend only partially over the metal gates 14a and 14b, or alternatively only within the trench between the metal gates 14a and 14b.

In the alternative embodiments, the insulator material 16 would preferably extend over the metal gates 14a and 14b, contacting the conductive material.

Second Aspect of the Invention

Figure 6:
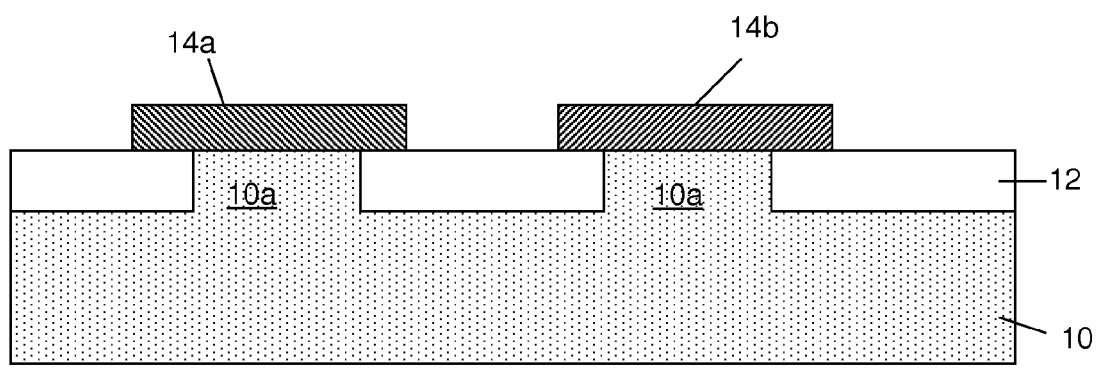
FIGS. 6-9 show structures and respective processing steps for forming a dense interconnect structure in accordance with a second aspect of the invention.

FIG. 6 shows a starting structure and respective processing steps for forming a dense interconnect structure in accordance with a second aspect of the invention. The starting structure includes, for example, shallow trench isolation structures 12 formed in a silicon or BULK wafer 10. The shallow trench isolation structures 12 can be formed in any conventional manner known by those of skill in the art, as discussed with reference to FIG. 1. The shallow trench isolation structures 12 are about 20 nm to about 150 nm in depth. Metal gates 14a and 14b are formed over islands 10a and, in embodiments, extend over the shallow trench isolation structures 12.

Still referring to FIG. 6, as should be understood by those of skill in the art the metal gates 14a and 14b can be formed using different conventional process, including those described with reference to FIG. 1. In addition to the processes already described, the metal gates can be formed using other conventional processes. For example, to form the metal gates 14a and 14b, a mask is formed over the wafer 10 and the shallow isolation structures 12. A blocking material is formed over the mask, and portions of the mask are exposed to light to form openings. Metal is then deposited in the openings to form the nFET gate, for example (or vice versa). To form the pFET gate (or vice versa), the process is repeated, while masking (protecting) the previously formed nFET gate. This formation process can also be implemented with the other aspects of the invention.

Figure 7:
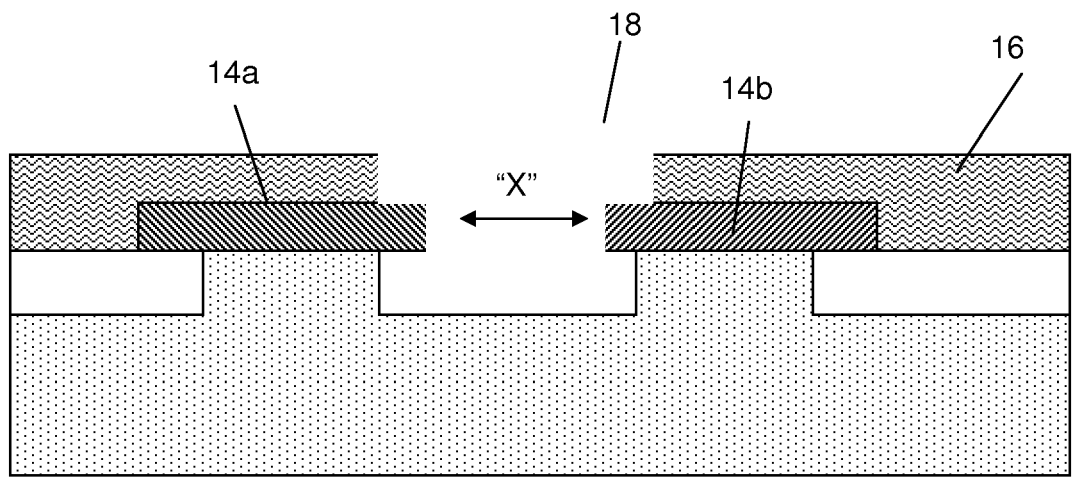

In FIG. 7, insulator material 16 is blanket deposited over the structure of FIG. 6 and a trench 18 is formed between the metal gates 14a and 14b using a conventional photolithographic and etching process. In embodiments, prior to the formation of the trench 18, the insulator material 16 may be planarized. In embodiments, the insulator material 16 extends partially over the metal gates 14a and 14b. As previously discussed, the insulator material 16 may be, for example, oxide, nitride or other high k dielectric material. The insulator material 16 may be about 90 nm to 300 nm in height and is preferably about three times the height of the metal gates 14a and 14b.

As previously discussed the metal gates 14a and 14b are separated by a distance "X", which is a technology critical dimension. The metal gates 14a and 14b are composed of different materials and are used for nFETs and pFETS in a CMOS device. By way of example, the metal gate 14a may be Titanium, TiN or Titanium tailored with rare earth elements; whereas, the metal gate 14b may be Tungsten, Tungsten Nitride or Tungsten tailored with rare earth elements. Of course, it should be recognized by those of skill in the art that the material of the metal gates 14a and 14b may be reversed, or may include additional or alternative conductive material known to be used with CMOS devices.

Figure 8:
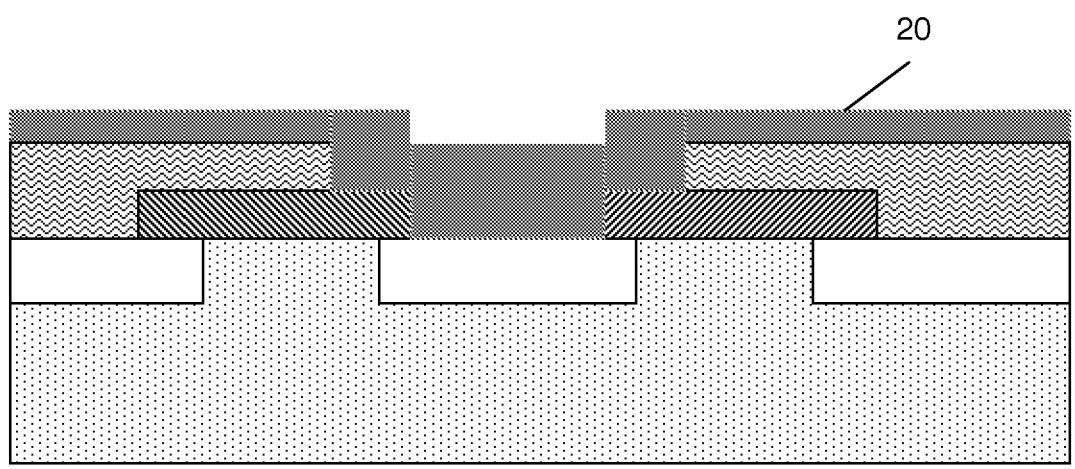

In FIG. 8, a conductive material 20 is blanket deposited over the structure of FIG. 7. In this manner, the conductive material 20 fills the trench 18 formed between the metal gates 14a and 14b. The conductive material 20 thus makes electrical contact with the metal gates 14a and 14b. The conductive material 20 may be, for example, aluminum or tungsten. Alternatively, the conductive material may be doped polysilicon.

Figure 9:
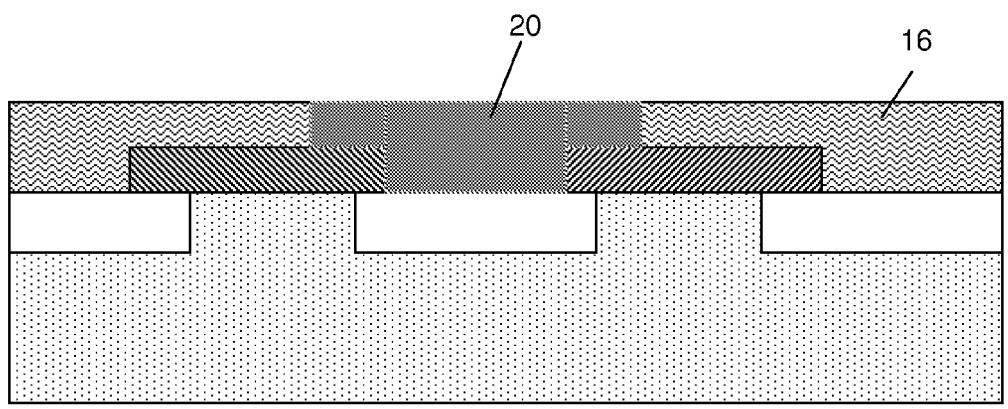

In FIG. 9, the structure of FIG. 8 is planarized or etched back to form the final structure in accordance with the second aspect of the invention. More specifically, the conductive material 20 may be subjected to a chemical mechanical polish in order to provide a planar surface of the structure, leaving behind the conductive material within the trench, i.e., between and in contact with the metal gates 14a and 14b. The planarization process of FIG. 9 forms a conductive filler strap 20 that extends between the metal gates 14a and 14b in the trench and extends over the metal gates 14a, 14b to the insulator material 16 (also formed over the gates 14a, 14b, in embodiments). In embodiments, the conductive filler strap 20 can be etched back to extend only within the trench between the metal gates 14a and 14b. In the alternative embodiments, the insulator material 16 would preferably extend over the metal gates 14a and 14b, contacting the conductive material.

Third Aspect of the Invention

Figure 10:
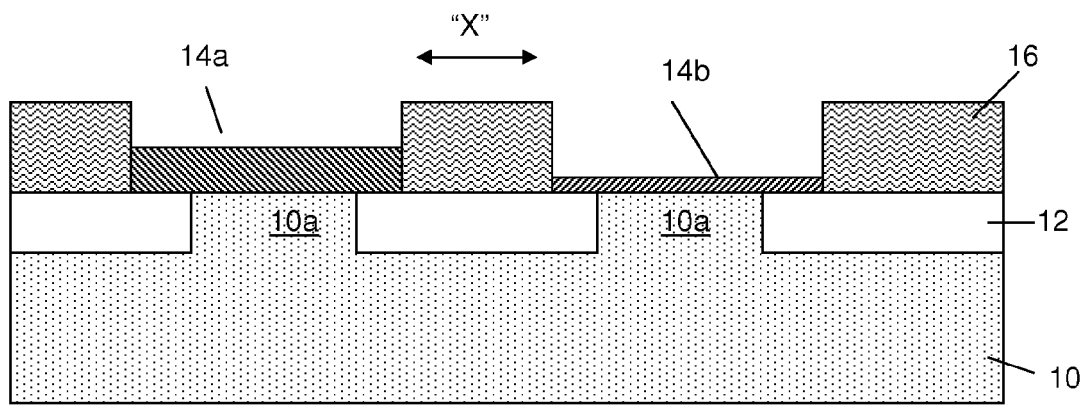
FIGS. 10-13 show structures and respective processing steps for forming a dense interconnect structure in accordance with a third aspect of the invention.

FIGS. 10-13 show structures and respective processing steps for forming a dense interconnect structure in accordance with a third aspect of the invention. In particular, the starting structure of FIG. 10 shows shallow trench isolation structures 12 formed in a silicon or BULK wafer 10. The shallow trench isolation structures 12 can be formed in any conventional manner known by those of skill in the art, as discussed above. The shallow trench isolation structures 12 can be about 20 nm to 150 nm in depth. Islands 10a are formed between the shallow trench isolation structures 12.

Still referring to FIG. 10, metal gates 14a and 14b are formed over the islands 10a and, in embodiments, extend over the shallow trench isolation structures 12. In the starting structure of FIG. 10, the metal gates 14a and 14b are of a different height and are separated by a distance "X", which is a technology critical dimension. The metal gates 14a and 14b are composed of different materials such as, for example, Titanium, TiN or Titanium tailored with rare earth elements, or Tungsten, Tungsten Nitride or Tungsten tailored with rare earth elements. In embodiments, the metal gates 14a and 14b can be formed using different conventional fabrication processes, any of which are discussed above with respect to either FIG. 1 or FIG. 6, for example.

Insulator material 16 extends between and on the sides of the metal gates 14a and 14b, similar to that discussed with reference to FIG. 1. The insulator material 16 may be, for example, oxide, nitride or other high k dielectric material. The insulator material 16 may be about 90 nm to 300 nm in height and is preferably about three times the height of the metal gate 14a. In embodiments, the metal gates 14a and 14b are recessed in comparison to the surrounding insulator material 16.

Figure 11:
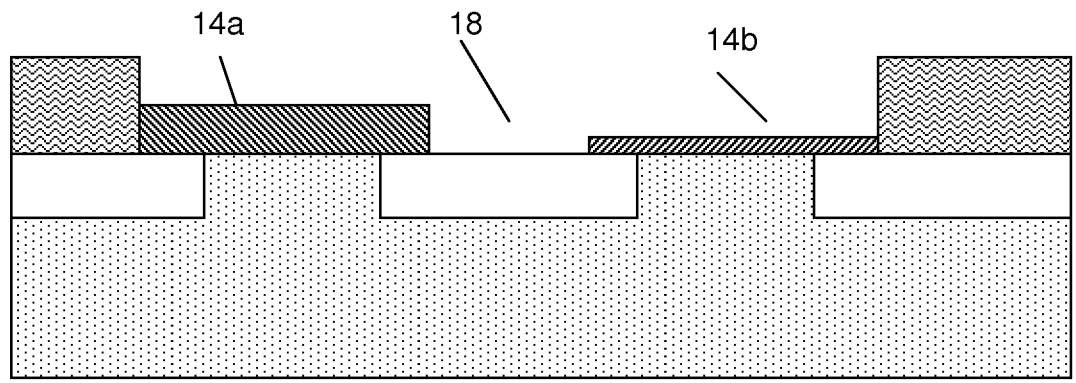

FIG. 11 shows the formation of a trench 18 between the two metal gates 14a, 14b. More specifically, using a photolithographic process, a mask is formed over the structure of FIG. 10. The mask is exposed to form a hole, in order to selective etch the insulator material 16 between the metal gates 14a and 14b. This etching process forms the trench 18 between the metal gates 14a and 14b.

Figure 12:
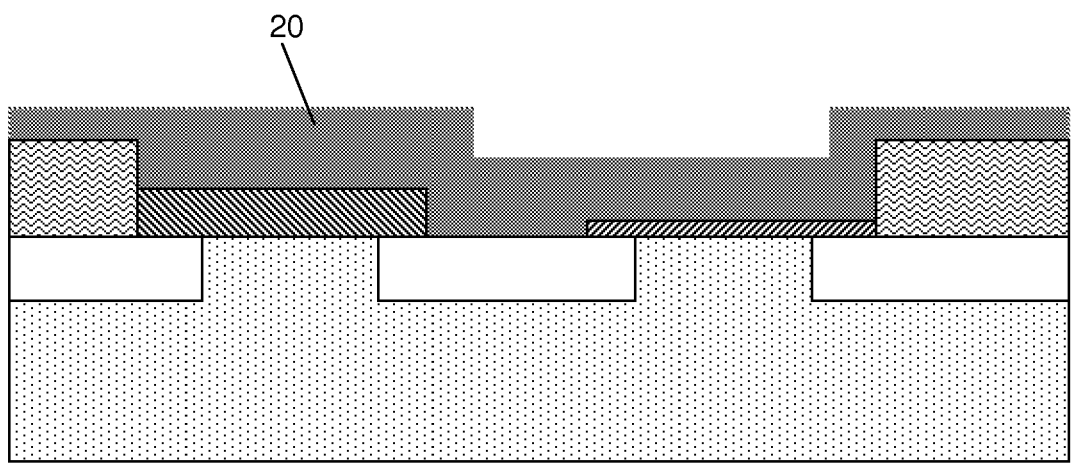

FIG. 12 shows a blanket deposition of a conductive material 20 over the structure of FIG. 11. In this manner, the conductive material 20 fills the trench 18 between the metal gates 14a and 14b. The conductive material 20 may also form part of the metal gate 14b. The conductive material 20 thus makes electrical contact with the metal gates 14a and 14b. In embodiments, the conductive material 20 may be, for example, aluminum or tungsten. Alternatively, the conductive material 20 may be doped polysilicon.

Figure 13:
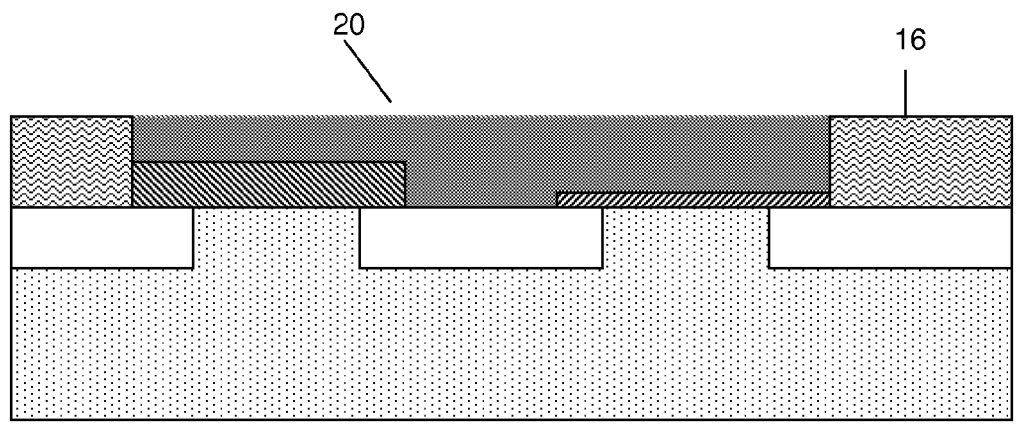

In FIG. 13, the structure of FIG. 12 is etched backed or planarized to form the final structure in accordance with the third aspect of the invention. More specifically, the conductive material 20 may be subjected to a chemical mechanical polish in order to provide a substantial planar surface with the insulator material 16. The planarization process of FIG. 13 forms a conductive filler strap 20 that extends between and contacts the metal gates 14a and 14b in the trench. In embodiments, the conductive filler strap 20 extends over the metal gates 14a, 14b to the insulator material 16 on the sides of the metal gates 14a, 14b. In embodiments, the conductive filler strap 20 can be etched back to extend only partially over the metal gates 14a and 14b, or alternatively only within the trench between the metal gates 14a and 14b. In the alternative embodiments, the insulator material 16 would preferably extend over the metal gates 14a and 14b, contacting the conductive material.

Fourth Aspect of the Invention

Figure 14:
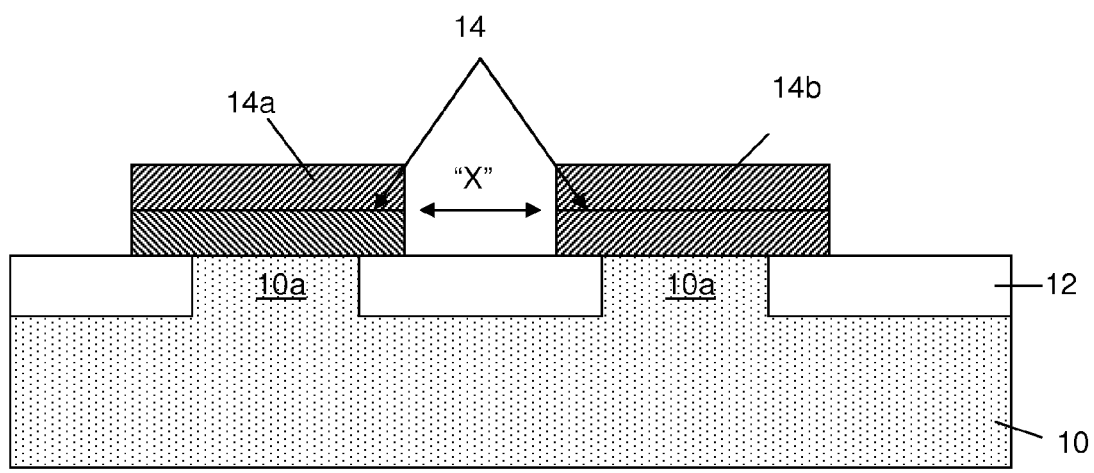
FIGS. 14-21 show structures and respective processing steps for forming a dense interconnect structure in accordance with a fourth aspect of the invention.

FIGS. 14-21 show structures and respective processing steps for forming a dense interconnect structure in accordance with a fourth aspect of the invention. In particular, the starting structure of FIG. 14 shows shallow trench isolation structures 12 formed in a silicon or BULK wafer 10. The shallow trench isolation structures 12 can be formed in any conventional manner known by those of skill in the art, as discussed above. The shallow trench isolation structures 12 can be about 20 to 150 nm in depth. Islands 10a are formed between the shallow trench isolation structures 12.

Still referring to FIG. 14, metal gates 14a and 14b are formed over the islands 10a and, in embodiments, extend over the shallow trench isolation structures 12. In the starting structure of FIG. 14, each of the metal gates 14a and 14b is formed of two different materials, using conventional deposition processes. The height of each material may range from about 2 nm to about 30 nm, depending on the technology application. In optional embodiments, a thin barrier layer 14 may be provided between each of the different layers in each of the metal gates 14a and 14b in order to prevent diffusion of the metal layers. In embodiments, the metal gates 14a and 14b are separated by a distance "X", which is a technology critical dimension. As discussed in detail above, the metal gates 14a and 14b are composed of different materials such as, for example, Titanium, TiN or Titanium tailored with rare earth elements, or Tungsten, Tungsten Nitride or Tungsten tailored with rare earth elements.

Figure 15:
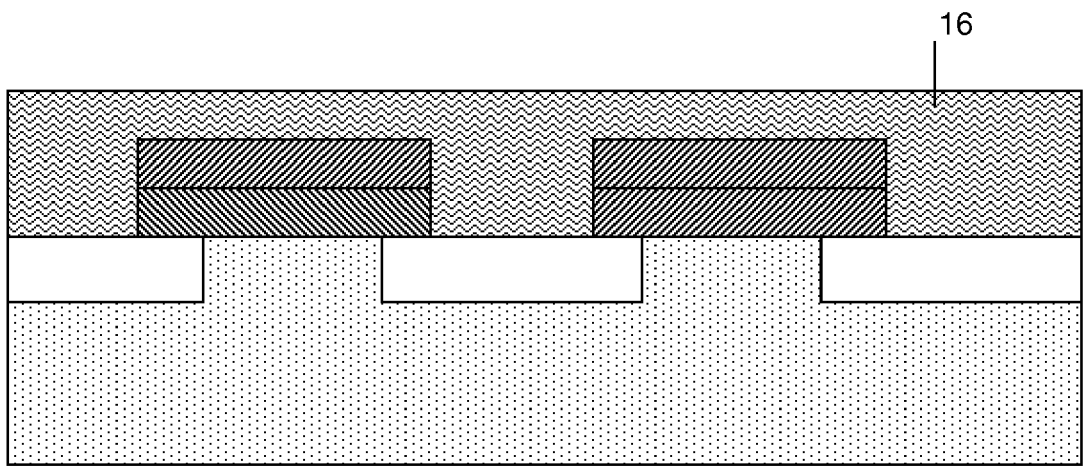

As shown in FIG. 15, insulator material 16 is blanket deposited over the structure of FIG. 14. The deposition of the insulator material 16 can be performed in any conventional manner. The insulator material 16 is also planarized to form a substantially planar surface. The insulator material 16 may be, for example, oxide, nitride or other high k dielectric material. The insulator material 16 may be about 90 nm to 300 nm in height and is preferably about three times the height of the metal gates 14a and 14b. In embodiments, the metal gates 14a and 14b are recessed in comparison to the surrounding insulator material 16.

Figure 16:
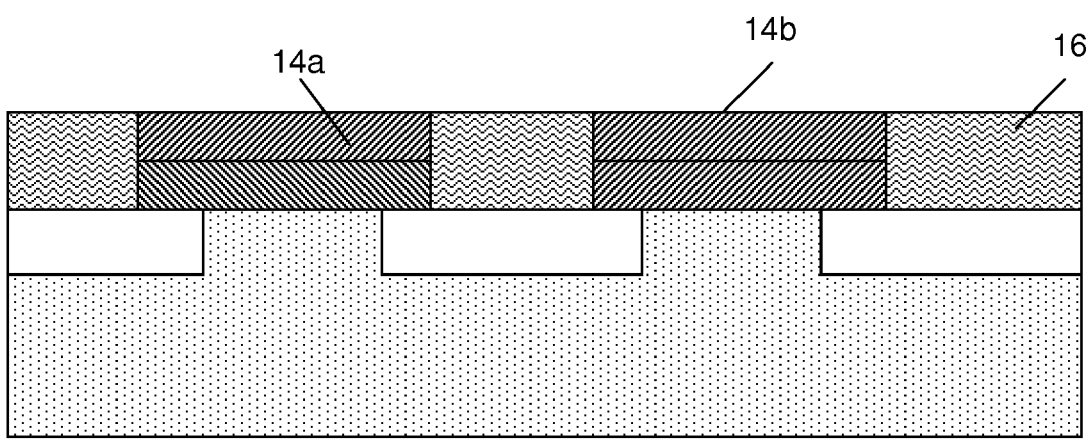
Figure 17:
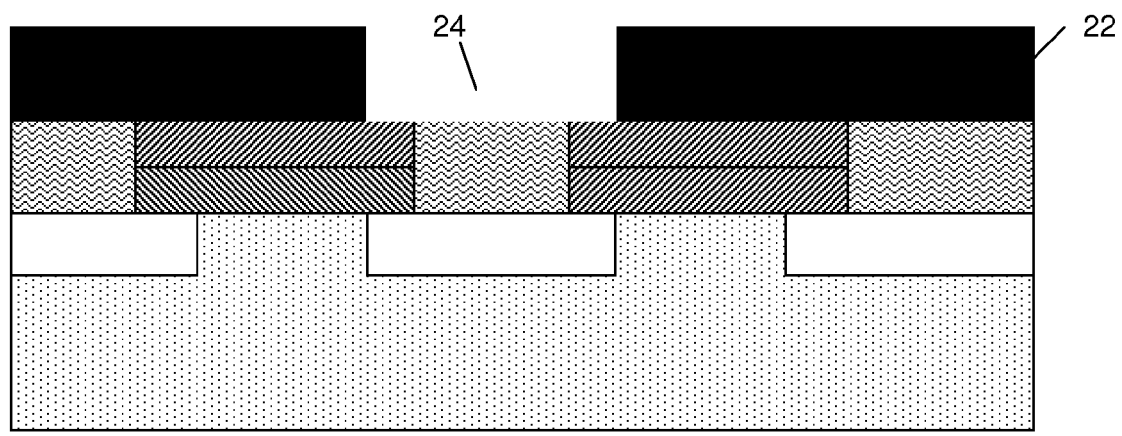
Figure 18:
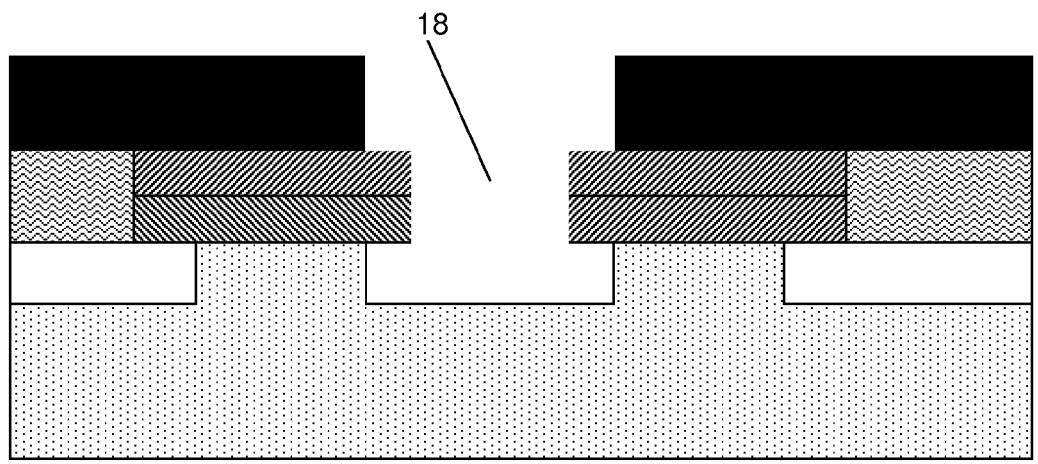
Figure 19:
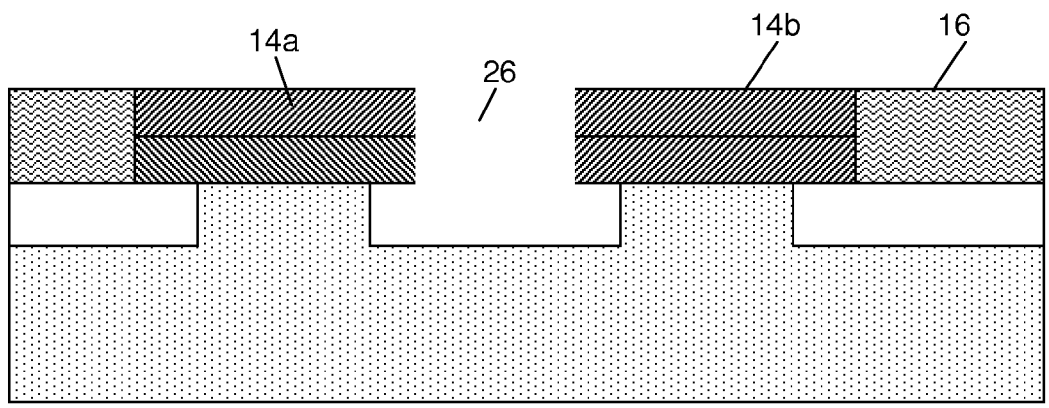

In FIG. 16, the structure of FIG. 15 is etched back or planarized such that the metal gates 14a, 14b and the insulator material 16 form a substantially planar surface. In FIG. 17, a resist mask 22 is deposited over the structure of FIG. 16. A hole 24 is formed in the resist mask 22 using conventional lithographic processes. The hole 24 preferably aligns with the insulator material between the metal gates 14a and 14b. In FIG. 18, a conventional etching process is performed to etch the exposed insulator material 16 thereby forming a trench 18. In FIG. 19, the resist material is stripped.

Figure 20:
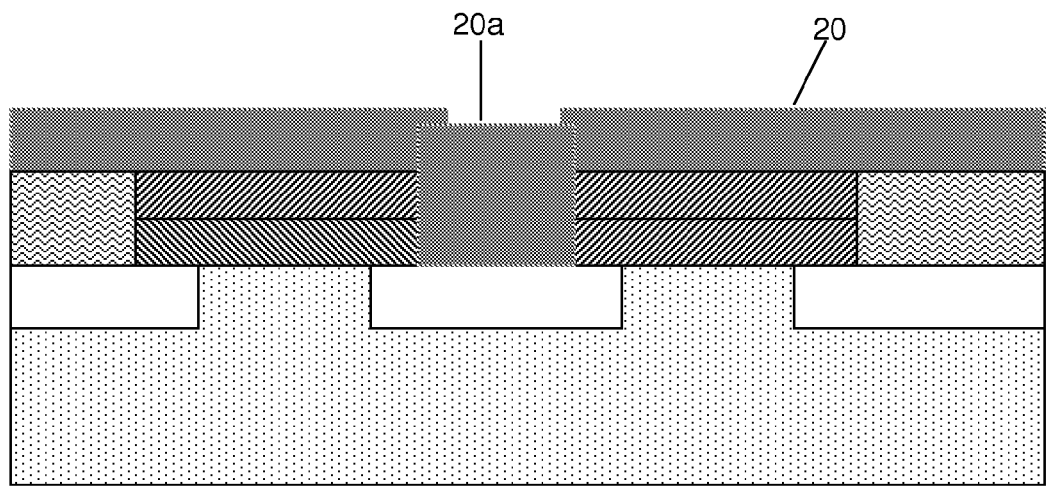

FIG. 20 shows a blanket deposition of a conductive material 20 over the structure of FIG. 19. In this manner, the conductive material 20 fills the trench 18 formed between the metal gates 14a and 14b. The conductive material 20 thus makes electrical contact with the metal gates 14a and 14b. The conductive material 20 may be, for example, aluminum or tungsten. Alternatively, the conductive material may be doped polysilicon.

Figure 21:
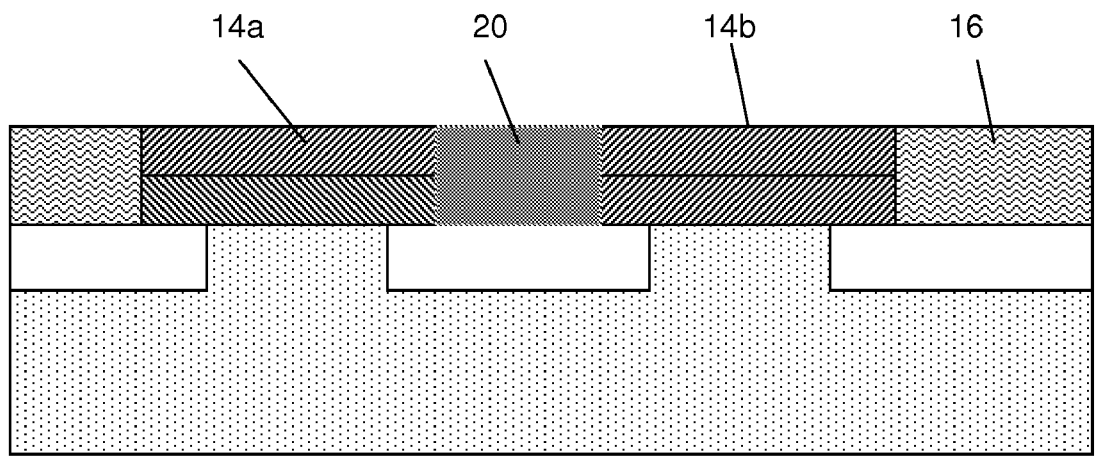

In FIG. 21, the structure of FIG. 20 is planarized to form the final structure in accordance with the fourth aspect of the invention. More specifically, the conductive material 20 may be subjected to a chemical mechanical polish in order to provide a substantially planar surface. The planarization process of FIG. 21 forms a conductive filler strap 20 that extends between the metal gates 14a and 14b in the trench.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A method comprising:
   forming a first metal gate on a wafer and second metal gate on the wafer; and
   depositing a conductive interconnect material in a space formed between the first metal gate and the second metal gate such that the conductive interconnect material is in electrical contact with at least a vertical side of the first metal gate and at least a vertical side of the second metal gate to provide an electrical interconnection between the first metal gate and the second metal gate.

2. The method of claim 1, further comprising depositing an insulator material on the wafer, wherein the space is formed by etching the insulator material between the first metal gate and the second metal gate.

3. The method of claim 2, wherein the space is a trench and the depositing the conductive interconnect material is a self aligning process.

4. The method of claim 1, wherein the first metal gate is an nFET gate and the second metal gate is a pFET gate.

5. The method of claim 4, wherein the first metal gate is comprised of a first conductive metal and the second metal gate is comprised of a second conductive metal, different from the first conductive metal.

6. The method of claim 1, wherein the conductive interconnect material is a doped polysilicon, Tungsten or aluminum.

7. The method of claim 1, further comprising depositing the conductive interconnect material over the first metal gate and the second metal gate.

8. The method of claim 7, further comprising depositing an insulator material on the wafer, wherein the conductive interconnect material is formed partially over the first metal gate and the second metal gate and extends to the insulator material.

9. The method of claim 1, wherein the first metal gate and the second gate include at least two types of metal.

10. The method of claim 9, further comprising providing a barrier layer between the at least two types of metal.

11. The method of claim 1, wherein the first metal gate and the second metal gate are of a different height prior to the depositing of the conductive material.

12. The method of claim 1, further comprising depositing the conductive interconnect material over the first metal gate and the second metal gate such that the interconnect material is in electrical contact with at least a portion of a top side and the vertical side of the first gate and at least a portion of a top side and the vertical side of the second gate.

13. A method comprising:
   forming a first gate of a first conductivity type on a wafer;
   forming a second gate of a second conductivity type on the wafer, remote from the first gate;
   depositing an interconnect structure in a space formed between the first gate and the second gate and in electrical contact with at least a vertical side of the first gate and at least a vertical side of the second gate.

14. The method of claim 13, further comprising depositing the interconnect structure over the first gate and the second gate.

15. The method of claim 13, wherein the forming of the first gate and the second gate includes forming the first gate at a higher height than the second gate and the interconnect structure forms a portion of the second gate.

16. The method of claim 13, wherein the depositing the interconnect structure is formed in a self aligning process.

* * * * *